(12) United States Patent  
Daanoune et al.

(10) Patent No.: US 12,550,486 B2  
(45) Date of Patent: Feb. 10, 2026

(54) OPTOELECTRONIC DEVICE WITH AXIAL THREE-DIMENSIONAL LIGHT-EMITTING DIODES

(71) Applicant: Aledia, Echirolles (FR)

(72) Inventors: Mehdi Daanoune, Renage (FR); Olga Kryliouk, Fort Myers, FL (US)

(73) Assignee: Aledia, Echirolles (FR)

( * ) Notice: Subject to any disclaimer, the term of this patent is extended or adjusted under 35 U.S.C. 154(b) by 427 days.

(21) Appl. No.: 18/267,422

(22) PCT Filed: Dec. 15, 2021

(86) PCT No.: PCT/EP2021/086032
§ 371 (c)(1),
(2) Date: Jun. 14, 2023

(87) PCT Pub. No.: WO2022/129252
PCT Pub. Date: Jun. 23, 2022

(65) Prior Publication Data
US 2024/0047610 A1   Feb. 8, 2024

(30) Foreign Application Priority Data

Dec. 17, 2020   (FR) ..................................... 2013518

(51) Int. Cl.
*H10H 20/818*   (2025.01)
*H10H 20/812*   (2025.01)
(Continued)

(52) U.S. Cl.
CPC ........ *H10H 20/818* (2025.01); *H10H 20/812* (2025.01); *H10H 20/813* (2025.01); *H10H 20/821* (2025.01); *H10H 20/872* (2025.01)

(58) Field of Classification Search
CPC .................................................. H10H 20/818
(Continued)

(56) References Cited

U.S. PATENT DOCUMENTS

2006/0223211 A1   10/2006 Mishra et al.
2024/0063191 A1*  2/2024 Kryliouk .............. H10H 20/855

FOREIGN PATENT DOCUMENTS

FR          3 083 002 A1   12/2019
WO     WO 2006/134568 A1   12/2006

OTHER PUBLICATIONS

International Search Report and Written Opinion for International Application No. PCT/EP2021/086032, mailed Mar. 23, 2022.
(Continued)

*Primary Examiner* — Hsin Yi Hsieh
(74) *Attorney, Agent, or Firm* — Wolf, Greenfield & Sacks, P.C.

(57) ABSTRACT

An optoelectronic device including a matrix of axial light-emitting diodes (LEDs). Each LED includes an active layer emitting electromagnetic radiation. The matrix forms a photonic crystal having at least first and second resonant peaks in a plane containing the active layers, each first and second peak amplifying the radiation intensity at a first and second wavelength respectively. Each light emitting diode includes an elongated semiconductor element, having a first portion of a first average diameter, a second portion extending the first portion and having a cross-sectional area decreasing away from the first portion, and the active layer extending the second portion and having a second average diameter strictly less than the first average diameter, the active layers being located at the first peak locations and absent at the secondary peak locations.

10 Claims, 9 Drawing Sheets

(51) Int. Cl.
*H10H 20/813* (2025.01)
*H10H 20/821* (2025.01)
*H10H 20/80* (2025.01)

(58) Field of Classification Search
USPC .......................................................... 257/13
See application file for complete search history.

(56) References Cited

OTHER PUBLICATIONS

Kölper et al., Towards nanorod LEDs: Numerical predictions and controlled growth. Physica Status Solidi C. Apr. 2011;8(7-8):2305-7.
Lewins et al., Strong photonic crystal behavior in regular arrays of core-shell and quantum disc InGaN/GaN nanorod light-emitting diodes. Journal of Applied Physics. Jul. 28, 2014;116(4):044305.
International Preliminary Report on Patentability for International Application No. PCT/EP2021/086032, mailed Jun. 29, 2023.

* cited by examiner

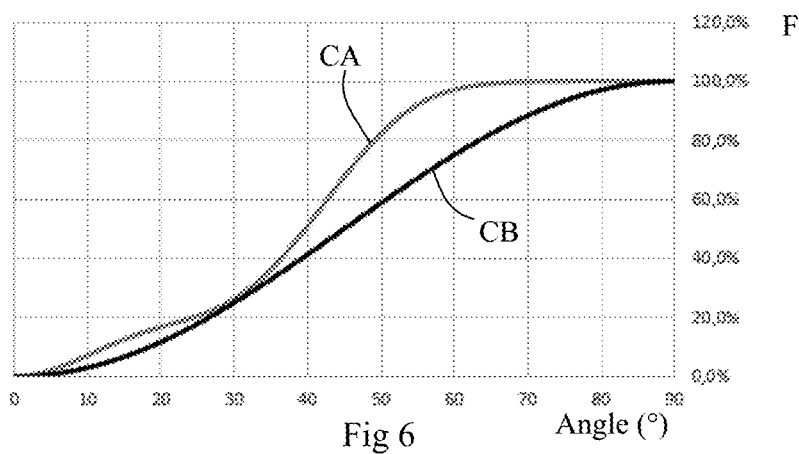
Fig 6
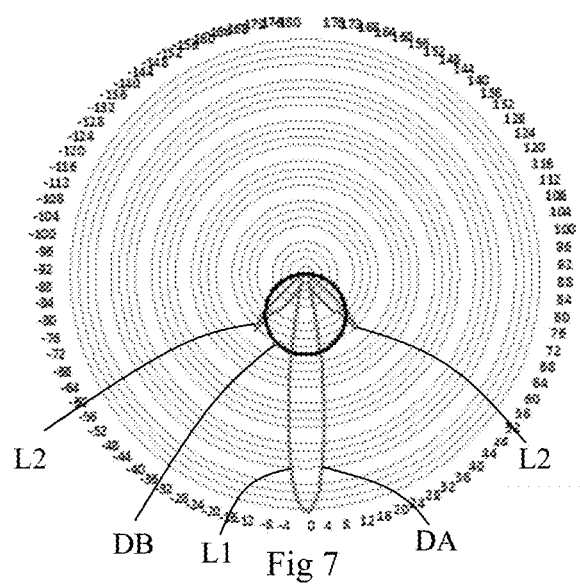
Fig 7
Fig 8

OPTOELECTRONIC DEVICE WITH AXIAL THREE-DIMENSIONAL LIGHT-EMITTING DIODES

CROSS-REFERENCE TO RELATED APPLICATIONS

This application is a national stage filing under 35 U.S.C. § 371 of International Patent Application Serial No. PCT/EP2021/086032, filed Dec. 15, 2021, which claims priority to French patent application FR20/13518, filed Dec. 17, 2020. The contents of these applications are incorporated herein by reference in their entirety.

TECHNICAL FIELD

The present disclosure relates to an optoelectronic device, in particular a display screen or an image projection device comprising light-emitting diodes [LEDs] based on semiconductor materials, and their manufacturing methods.

BACKGROUND ART

For certain applications, it is desired to obtain light-emitting diodes emitting electromagnetic radiation with a narrow spectrum, ideally substantially monochromatic, and/or light-emitting diodes whose emission is as directive as possible.

An optoelectronic three-dimensional light-emitting diode [LED} device of an axial type may have such properties. An axial-type three-dimensional light-emitting diode is a LED comprising an elongated three-dimensional semiconductor element extending along a preferred direction, a wire of a diameter in micrometers or nanometers, for example, comprising an active layer at an axial end of the three-dimensional semiconductor element, the active layer being the LED region from which the majority of the electromagnetic radiation provided by the LED is emitted.

However, for some applications where an optoelectronic device emitting very narrow spectrum and/or highly directional radiation is desired, known three-dimensional axial-type LEDs may not be satisfactory.

SUMMARY OF INVENTION

Thus, an object of one embodiment is to address all or some of the drawbacks of the LED optoelectronic devices described above.

Another object of one embodiment is for the three-dimensional axial-type LEDs to have a narrow emission spectrum.

Another object of one embodiment is for the axial-type three-dimensional LEDs to emit directional radiation.

One embodiment provides an optoelectronic device comprising a matrix of axial LEDs, each LED comprising an active layer configured to emit electromagnetic radiation, the matrix forming a photonic crystal configured to form at least first and second resonance peaks, in a plane containing the active layers, each first resonance peak amplifying the intensity of said electromagnetic radiation at a first wavelength, each second resonance peak amplifying the intensity of said electromagnetic radiation at a second wavelength, wherein each light emitting diode (LED) comprises an elongated semiconductor element along an axis having a first portion having a first average diameter, a second portion extending the first portion and having a cross-sectional area decreasing away from the first portion, and the active layer extending the second portion and having a second average diameter strictly less than the first average diameter, the active layers being located at the locations of the first resonance peaks and absent at the locations of the second resonance peaks.

According to one embodiment, twice the ratio between the second average diameter and the first average diameter is between 0.5 and 1.8.

According to one embodiment, twice the ratio between the second average diameter and the first average diameter is between 0.6 and 1.4.

According to one embodiment, the first average diameter is between 0.05 µm and 2 µm.

According to one embodiment, the first average diameter is between 100 nm and 1 µm.

According to one embodiment, the height of the second portion, measured along said axis, is less than 10% of the height of the elongated semiconductor element, measured along said axis.

According to one embodiment, the first portion of the elongated semiconductor element has a constant cross-section.

According to one embodiment, the axial LEDs are arranged in an array with a pitch of between 0.1 µm and 4 µm.

According to one embodiment, the height of each elongated semiconductor element, measured along said axis, is between 100 nm and 50 µm.

One embodiment also provides a method for designing the optoelectronic device as defined above, comprising the following steps:

a) determining the photonic crystal pitch and the first average diameter by simulation, considering that the elongated semiconductor elements have a constant cross-section;

b) decreasing the second average diameter without changing the first average diameter;

c) simulating the operation of the optoelectronic device with the active layers having the decreased second average diameter; and d) repeat steps b) and c) until the active layers are located at the locations of the first resonant peaks and absent at the locations of the second resonant peaks.

BRIEF DESCRIPTION OF DRAWINGS

The foregoing features and advantages, as well as others, will be described in detail in the following description of specific embodiments given by way of illustration and not limitation with reference to the accompanying drawings, in which:

FIG. 6 shows the evolution curves of the cumulative flux of the radiation emitted by the optoelectronic comparison device and Lambertian radiation, respectively;

FIG. 7 shows a radiation diagram for the radiation emitted by the comparison optoelectronic device and Lambertian radiation;

FIG. 8 is a grayscale map of a first mode amplification factor for the comparison optoelectronic device in a plane containing the active layers of the LEDs;

DESCRIPTION OF EMBODIMENTS

Figure 1:
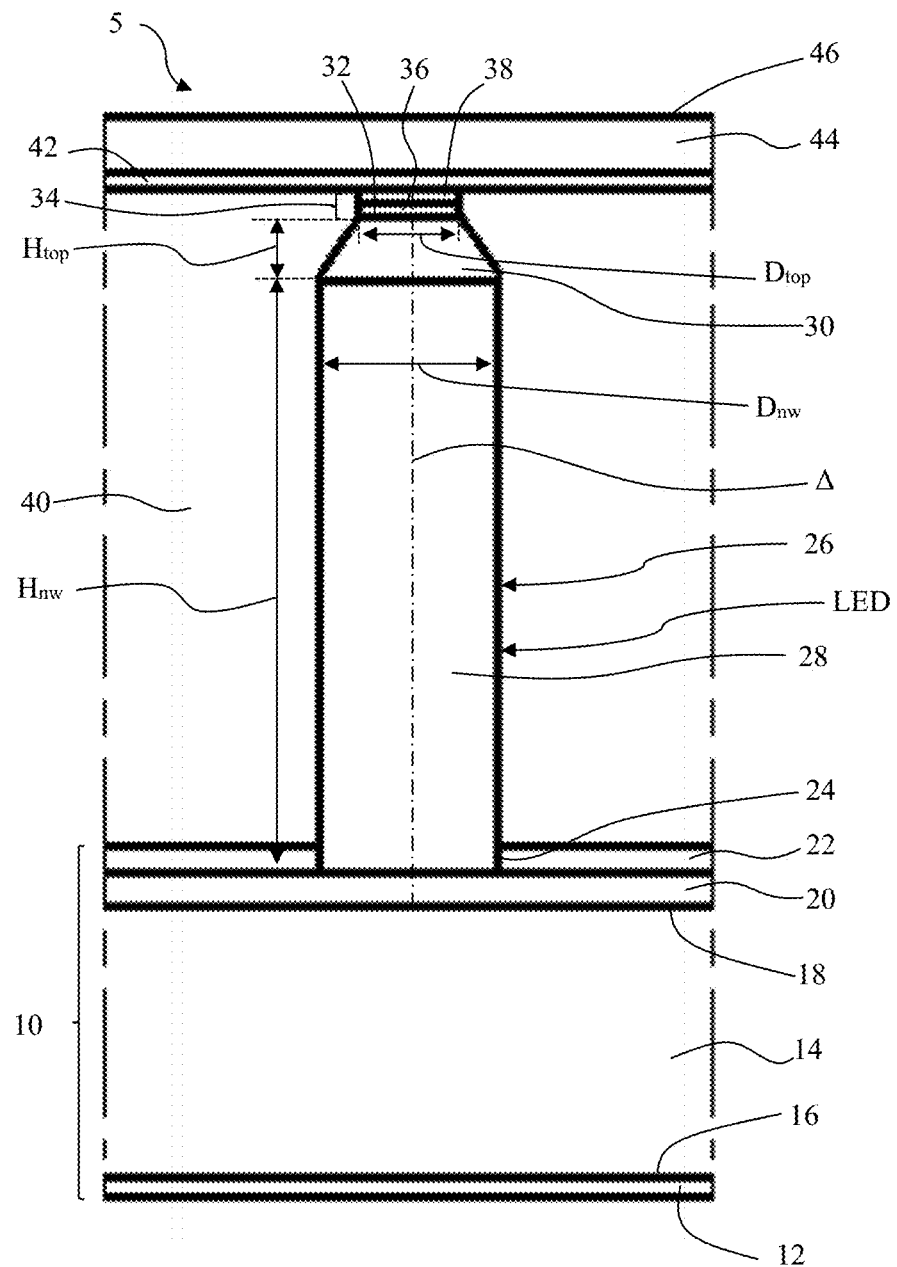
FIG. 1 is a schematic, partial, cross-sectional view of one embodiment of an optoelectronic device comprising LEDs.

Like features have been designated by like references in the various figures. In particular, the structural and/or functional features that are common among the various embodiments may have the same references and may dispose identical structural, dimensional and material properties. For the sake of clarity, only the operations and elements that are useful for an understanding of the embodiments described herein have been illustrated and described in detail. In particular, the optoelectronic devices considered may comprise other components that will not be detailed.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures, as orientated during normal use.

Unless specified otherwise, the expressions "around", "approximately", "substantially" and "in the order of" signify within 10%, and preferably within 5%. In addition, the terms "insulator" and "conductor" are herein understood to mean "electrically insulating" and "electrically conductive," respectively.

In the following description, the internal transmittance of a layer is the ratio of the radiation intensity exiting the layer to the radiation intensity entering the layer. The layer absorption is equal to the difference between 1 and the internal transmittance. In the remainder of the description, a layer is said to be transparent to radiation when the radiation absorption through the layer is less than 60%. In the remainder of the description, a layer is said to be radiation absorbent when the radiation absorption in the layer is greater than 60%. When radiation has a generally "bell-shaped" spectrum, such as a Gaussian spectrum, having a maximum, the radiation wavelength or central or main radiation wavelength, is called the wavelength at which the maximum of the spectrum is reached. In the remainder of the description, the refractive index of a material refers to the refractive index of the material for the wavelength range of the radiation emitted by the optoelectronic device. Unless otherwise specified, the refractive index is considered to be substantially constant over the wavelength range of the useful radiation, equal to the average of the refractive index over the wavelength range of the radiation emitted by the optoelectronic device, for example.

An axial LED means a three-dimensional structure of an elongated shape, such as cylindrical, along a preferred direction, with at least two dimensions, called minor dimensions, of between 5 nm and 2.5 µm, preferably between 50 nm and 2.5 µm. The third dimension, referred to as the major dimension, is greater than or equal to 1 time, preferably greater than or equal to 5 times and even more preferably greater than or equal to 10 times, the largest of the minor dimensions. In some embodiments, the minor dimensions may be less than or equal to about 1 µm, preferably between 100 nm and 1 µm, more preferably between 100 nm and 800 nm. In some embodiments, the height of each LED may be greater than or equal to 500 nm, preferably between 1 µm and 50 µm.

FIG. 1 is a schematic, partial, sectional side view of one embodiment of an optoelectronic LED device 5 in which the semiconductor elements correspond to nanowires or microwires, that makes it possible to obtain the emission of narrow spectrum and/or directional radiation.

The device 5 comprises:
a support 10, comprising a first electrode 12 for example, a substrate 14 such as a semiconductor, having parallel surfaces 16 and 18 with the surface 16 in contact with the electrode 12, a nucleation layer 20 covering the surface 18, and an insulating layer 22 covering the nucleation layer 20 and including openings 24 at the desired wire locations, with a single opening 24 shown in FIG. 1;

a matrix of light-emitting diodes LED, resting on the support 10, a single light-emitting diode LED being shown in FIG. 1, each light-emitting diode LED comprising a wire 26 in contact with the nucleation layer 20 in one of the openings 24, the wire 26 being at least partially doped with a first conductivity type such as N-type doping and comprising a substantially cylindrical bottom portion 28 in contact with the nucleation layer 20, and extending into an upper portion 30 whose cross-section decreases away from the substrate 14, the upper portion 30 having a top surface 32, each light-emitting diode LED further comprising a shell 34 covering the top surface 32 of the wire 26, the shell 34 comprising an active layer 36 and a semiconductor layer 38 doped with a second conductivity type such as P-type doping;

an insulating layer 40, covering the periphery of each wire 26 and each shell 34, transparent to the radiation emitted by the active layer 36;

an electrically conductive layer 42, transparent to the radiation emitted by the active layer 36, covering the insulating layer 40 and each shell 34, and in contact with each shell 34, the conductive layer 42 forming the second electrode; and an electrically insulating encapsulation layer 44, transparent to the radiation emitted by the active layer 36 and covering the entire structure, the encapsulation layer 44 having an upper surface 46, referred to as the emission surface.

The active layer 36 is the layer from which the majority of the electromagnetic radiation provided by the light-emitting diode LED is emitted. The light-emitting diodes LED may be connected in parallel and form a LED array. The array may comprise from a few light-emitting diodes LED to a thousand light-emitting diodes.

Each light-emitting diode LED is said to be axial in that the active layer 36 is in the extension of the wire 26 and the semiconductor layer 38 is in the extension of the active area 20, the assembly comprising the wire 26, the active layer 36, and the semiconductor layer 38 extending along an axis Δ, called the axis of the wire 26 or the axial LED axis. Preferably, the axes of light-emitting diodes LED are parallel and orthogonal to the surface 18.

The base of the wire 26 has an oval, circular or polygonal shape, for example, including triangular, rectangular, square or hexagonal. The cross-sectional area of the wire may be constant along the wire axis Δ or may vary along the wire axis. The average diameter of the lower portion 28 of the wire 26 is referred to as $D_{nw}$. In the case of a wire 26 whose lower portion 28 has a circular cross-sectional shape, the average diameter is the diameter of the circle. In the case of a wire 26 whose lower portion 28 has a cross-section other than a circle, the average diameter corresponds to the diameter of the circle bounding the same area as the cross-sectional area of the lower portion 28. The average diameter of the top surface 32 is further referred to as $D_{top}$. Preferably, the top surface 32 is flat. Preferably, the top surface 32 corresponds to a crystal plane perpendicular to the growth direction c of the crystal comprising the wire 26. In the case where the top surface 32 corresponds to a circle, the average diameter $D_{top}$ corresponds to the diameter of the circle. In the case where the top surface 32 is other than a circle, the average diameter $D_{top}$ corresponds to the diameter of the circle bounding the same area as the cross-sectional area of the top surface 32. The ratio of the diameter D top to the diameter $D_{nw}$ is referred to as the thinning ratio SF which is twice the ratio of the diameter D top to the diameter $D_{nw}$. Further, the height of the lower portion 28 of the wire 26, measured along the axis Δ, is referred to as $H_{nw}$ and the height of the upper portion 30 of the wire 26, measured along the axis, is referred to as $H_{top}$.

The diameter $D_{nw}$ may be between 0.05 μm and 2 μm, preferably between 100 nm and 1 μm, more preferably between 100 nm and 800 nm. According to one embodiment, the thinning ratio SF is less than 1.8, preferably less than 1.6, more preferably less than 1.4, even more preferably less than 1.2. According to one embodiment, the thinning ratio SF is greater than 0.5, preferably greater than 0.7, more preferably greater than 0.8.

According to one embodiment, the height of the wire 26, corresponding to the sum of the heights $H_{nw}$ and $H_{top}$, may be greater than or equal to 100 nm, preferably between 500 nm and 50 μm, more preferably between 1 μm and 50 μm. The height H top is less than 10%, preferably 8%, more preferably 5% of the height of the wire 26.

According to one embodiment, in the case where the cross-sectional area of the lower portion 28 of the wire 26 is not constant along the Δ axis, the lower portion 28 is defined as the portion of the wire 26 from the base to the contact of the support 10 for which the variations in the average diameter of the cross-sectional area remain less than 10%. The average diameter $D_{nw}$ of the lower portion 28 of the wire 26 may then correspond to the average diameter of the straight section of the lower portion 28 at the junction between the lower portion 28 and the upper portion 30, or may correspond to the average of the average diameters of the straight sections of the lower portion 28 of the wire 26 along the Δ axis.

In the embodiment shown in FIG. 1, the upper portion 30 has a frustoconical shape. In a variant, the upper portion 30 may have a flared, concave or convex shape.

Figure 2:
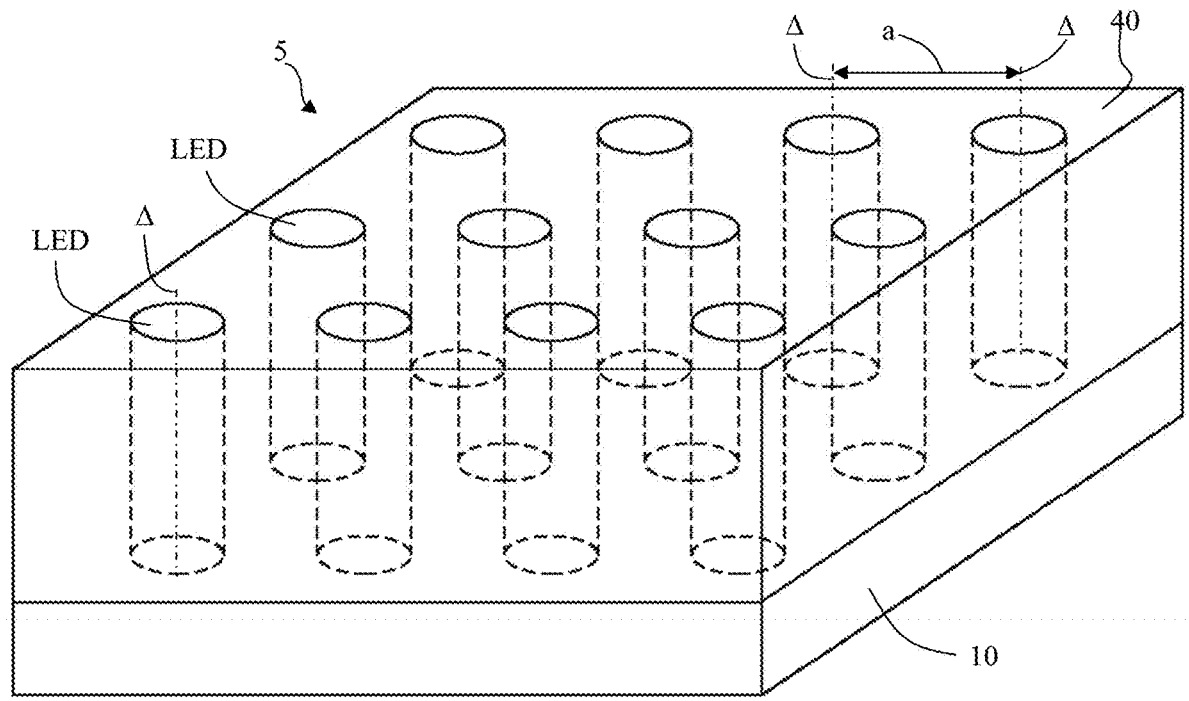
FIG. 2 is a schematic, partial perspective view of the optoelectronic device shown in FIG. 1.

FIG. 2 is a schematic, partial perspective view of the optoelectronic device 5. In FIG. 2, each light-emitting diode LED is shown schematically as a cylinder. In addition, the layers 42 and 44 are not shown.

According to one embodiment, the light-emitting diodes LED are arranged to form a photonic crystal. Twelve light-emitting diodes LED are shown as an example in FIG. 2. In practice, the light-emitting diode LED matrix may comprise between 7 and 100,000 light-emitting diodes LED.

According to one embodiment, the light-emitting diodes LED are arranged in rows and columns (3 rows and 4 columns being shown as an example in FIG. 2). The pitch 'a' of the matrix is the distance between the axis of a light-emitting diode LED and the Δ axis of a nearby light-emitting diode LED in the same or adjacent row. The pitch a is substantially constant. According to one embodiment, the pitch a may be between 0.1 μm and 4 μm.

More specifically, the pitch a of the matrix is chosen such that the matrix forms a photonic crystal. The photonic crystal formed is a 2D photonic crystal, for example. In the example arrangement shown in FIG. 2, referred to as a square arrangement, a light-emitting diode LED is located at each intersection of a row and a column, with the rows being perpendicular to the columns. According to another example arrangement, called a hexagonal arrangement, the LEDs on one row are offset by half the pitch a from the LEDs on the previous and next row.

The properties of the photonic crystal formed by the matrix are advantageously chosen so that the LED matrix forms a resonant cavity in the plane perpendicular to the Δ axis and a resonant cavity along the Δ axis, in particular to obtain coupling and increase the selection effect. This allows the intensity of the radiation emitted by the array of light-emitting diodes LED of the matrix through the emission surface 46 to be amplified for certain wavelengths compared to an array of light-emitting diodes LED that would not form a photonic crystal. It should be noted that the resonant peaks of the photonic crystal may be different from the wavelength for which the emission spectrum of the active layer 26, taken in isolation, is maximum. Advantageously, one of the resonance peaks of the photonic crystal is the same or close to the wavelength for which the emission spectrum of the active layer 26, taken in isolation, is maximum.

The properties of the photonic crystal are determined by the geometric dimensions of the elements comprising the optoelectronic device 5 and the materials comprising these elements. As a first approximation, the properties of the photonic crystal may be set by the wires 26.

According to one embodiment, the wires 26 and the shells 34 are made of a semiconductor material, at least in part. The semiconductor material is selected from the group consisting of III-V compounds, II-VI compounds, and Group IV semiconductors or compounds. Examples of Group III elements include gallium (Ga), indium (In) or aluminum (Al). Examples of Group IV elements include nitrogen (N), phosphorus (P) or arsenic (As). Examples of III-N compounds are GaN, AN, InN, InGaN, AlGaN or AlInGaN. Examples of Group II elements include Group IIA elements, including beryllium (Be) and magnesium (Mg) and Group IIB elements including zinc (Zn), cadmium (Cd), and mercury (Hg). Examples of Group VI elements include Group VIA elements, including oxygen (O) and tellurium (Te). Examples of Group II-VI compounds are ZnO, ZnMgO, CdZnO, CdZnMgO, CdHgTe, CdTe or HgTe. In general, the elements in compound III-V or II-VI can be combined with different molar fractions. Examples of Group IV semiconductor materials are silicon (Si), carbon (C), germanium (Ge), silicon carbide (SiC) alloys, silicon-germanium (SiGe) alloys or germanium carbide (GeC) alloys. The wires 26 and semiconductor layers 38 may comprise a dopant. As an example, for III-V compounds, the dopant may be selected from the group consisting of a Group II P-type dopant such as magnesium (Mg), zinc (Zn), cadmium (Cd) or mercury (Hg), a Group IV P-type dopant such as carbon (C) or a Group IV N-type dopant such as silicon (Si), germanium (Ge), selenium (Se), sulfur (S), terbium (Tb) or tin (Sn). Preferably, the semiconductor layer 38 is P-doped GaN and the wire 26 is N-doped GaN, at least partially.

The second electrode layer 42 is conductive and transparent. According to one embodiment, the electrode layer 42 is a transparent conductive oxide (TCO) layer such as indium tin oxide (or ITO), zinc oxide doped or undoped with aluminum or gallium, or graphene. As an example, the electrode layer 42 has a thickness of between 5 nm and 200 nm, preferably between 20 nm and 50 nm. The insulating layer 22 or 40 or the coating 44 may be made of an inorganic material, such as silicon oxide or silicon nitride. The insulating layer 40 and/or coating 44 may be of an organic material, such as a benzo-cyclobutene (BCB) based insulating polymer. The coating 44 may comprise an optical filter, or optical filters arranged adjacent to each other, as will be described in more detail later.

The seed layer 20 is made of a material that promotes the growth of the wires 26. By way of example, the material comprising the seed layer 20 may be a nitride, carbide, or boride of a transition metal of column IV, V, or VI of the periodic table of elements or a combination of these compounds. The seed layer 20 may be replaced by separate seed pads, with each wire 26 resting on a seed pad.

The support 10 may have a different structure than described above. According to one embodiment, the support 10 may correspond to an electronic circuit having a surface electrode layer on which the light emitting diodes rest. The electrode layer 12 may be divided into distinct parts so as to allow separate control of LED groups of the LED matrix.

Figure 3:
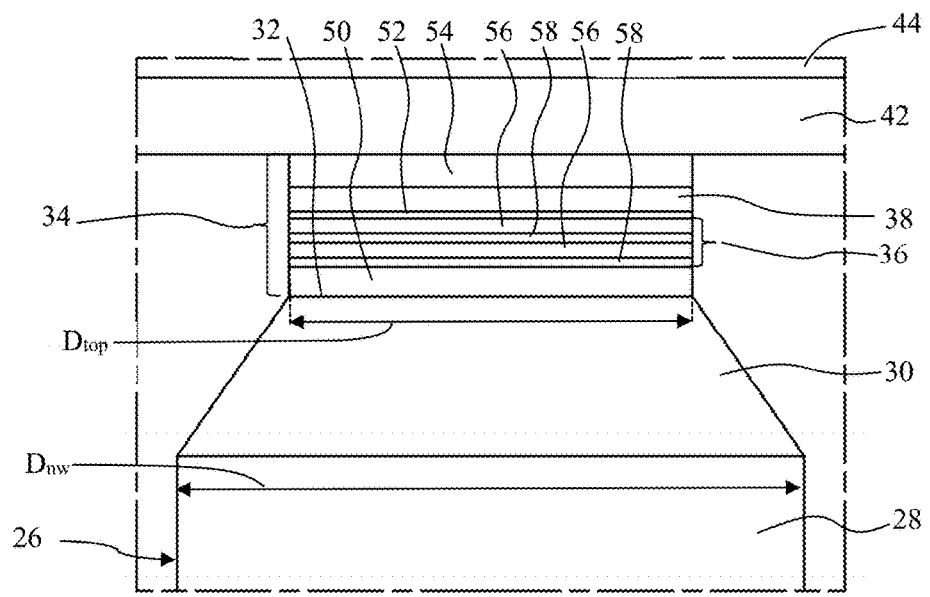
FIG. 3 is a schematic partial cross-sectional view corresponding to a detail view of a portion of the optoelectronic device shown in FIG. 1.

FIG. 3 is an enlarged view of the shell 34. The shell 34 may comprise a stack of multiple semiconductor layers including, but not limited to:

an interlayer 50, such as GaN, covering the top surface 32 of the top portion 30 of the wire 26;

the active layer 36 covering the interlayer 50, preferably in contact with the interlayer 50;

optionally, a barrier layer 52 covering the active layer 36;

the semiconductor layer 38 of an opposite conductivity type to the lower portion 28 of the wire 26 covering the barrier layer 52; and a bonding layer 54 covering the semiconductor layer 38, overlaid by the electrode layer 42 and in contact with the electrode layer 42.

The interlayer 50 is preferably a layer of the same semiconductor material as the upper portion 28 of the wire 26 or of a GaInN or AlGaN or AlGaInN type alloy. The interlayer 50 is intended to provide a surface with properties suitable for growing the active layer 36. The thickness of the interlayer 50 may be in the range of 5 nm to 5 µm, preferably 10 nm to 2000 nm.

The active layer 36 may include confinement means, such as multiple quantum wells. It is composed of alternating layers of GaN 56 and InGaN 58, for example, with two GaN layers 56 and two InGaN layers 58 shown as examples in FIG. 3. The GaN layers 56 may be doped, such as N or P type, or undoped. According to another example, the active layer 36 may comprise a single quantum well comprising a single InGaN layer, greater than 10 nm thick between two layers of GaN, for example.

The method for growing light-emitting diodes LED can be a method of the type or a combination of methods such as Chemical Vapor Deposition (CVD), Metal-Organic Chemical Vapor Deposition (MOCVD), also known as Metal-Organic Vapor Phase Epitaxy (MOVPE), or Remote Plasma Metal-Organic Chemical Vapor Deposition (RP-MOCVD). However, methods such as molecular beam epitaxy (MBE), gas source MBE (GSMBE), metal-organic MBE (MOMBE), plasma assisted MBE (PAMBE), atomic layer epitaxy (ALE) or hydride vapor phase epitaxy (HVPE) can be used. However, electrochemical methods can be used, such as chemical bath deposition (CBD), hydrothermal processes, liquid aerosol pyrolysis, or electrodeposition.

The formation of the top portions 30 of the wires 26 may be achieved by varying the growth conditions of the wires 26, between initial growth conditions that result in wires of diameter $D_{nw}$ and final growth conditions that result in wires of diameter D top, by gradually increasing the V/III ratio and lowering the temperature to achieve a decrease in diameter, for example.

According to one embodiment, the lower portions 28 of the wires are formed by MOCVD and the upper portions 30 of the wires 26 are formed by MBE.

Simulations and tests have been performed. For these simulations and tests the lower portion 28 and the upper portion 30 are made of N-doped GaN, for each light-emitting diode LED, The refractive index of the lower and upper portions 28 and 30 is between 2.4 and 2.5. The active layer 36 is a layer of InGaN. The semiconductor layer 38 is made of P-type doped GaN. The electrode layer 42 is made of TCO. The insulating layer 40 and the encapsulating layer 44 are made of BCB-based polymer. The refractive index of the insulating layer 40 is between 1.45 and 1.56. An array of light-emitting diodes LED distributed in a hexagonal mesh was considered. The height of the wire 26 is between 300 nm and 1 µm. The height of the upper portion 30 is between 20 nm and 300 nm. The thickness of the shell 34 is between 100 nm and 500 nm. The thickness of the electrode layer 42 is between 100 nm and 500 nm. The thickness of the encapsulation layer 44 is between 1 µm and 1 mm.

For the first simulation, the thinning ratio SF of the optoelectronic device 5 is equal to 2.

Figure 4:
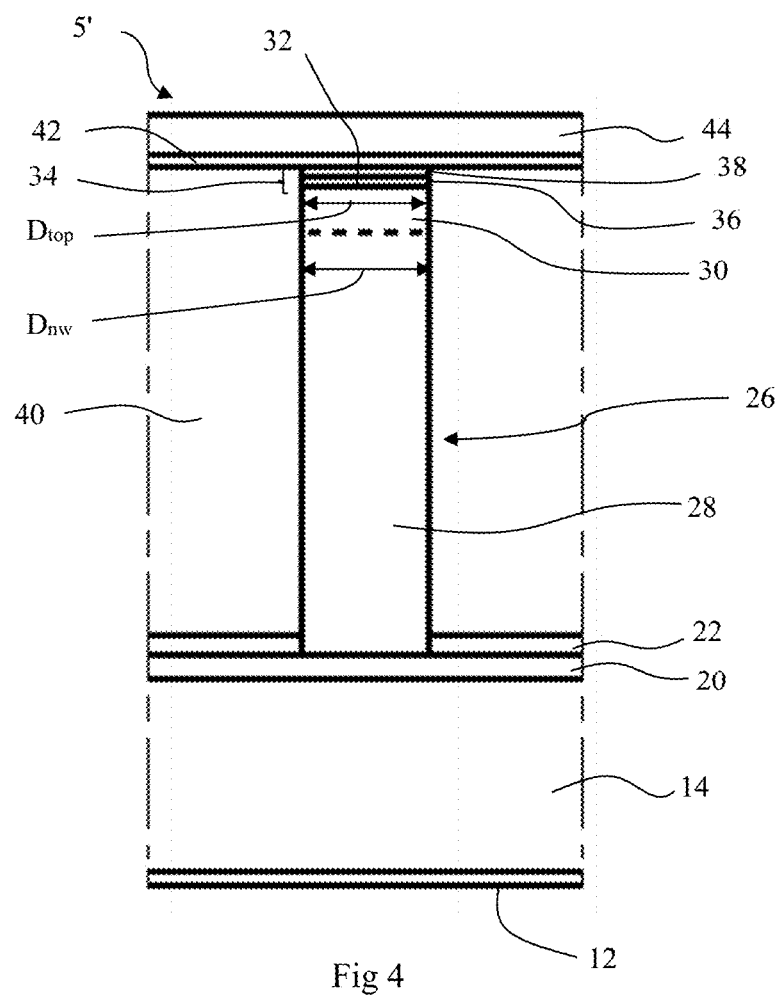
FIG. 4 is a schematic, partial, cross-sectional view of a comparison optoelectronic device used for a first simulation.

FIG. 4 is a schematic, partial cross-sectional view of the optoelectronic device 5' when the thinning ratio SF is equal to 2. The cross-sectional area of the upper portion 30 is substantially constant and identical to the cross-sectional area of the lower portion 28 of the wire 26. The optoelectronic device 5' according to this configuration is referred to as a comparison optoelectronic device.

Figure 5:
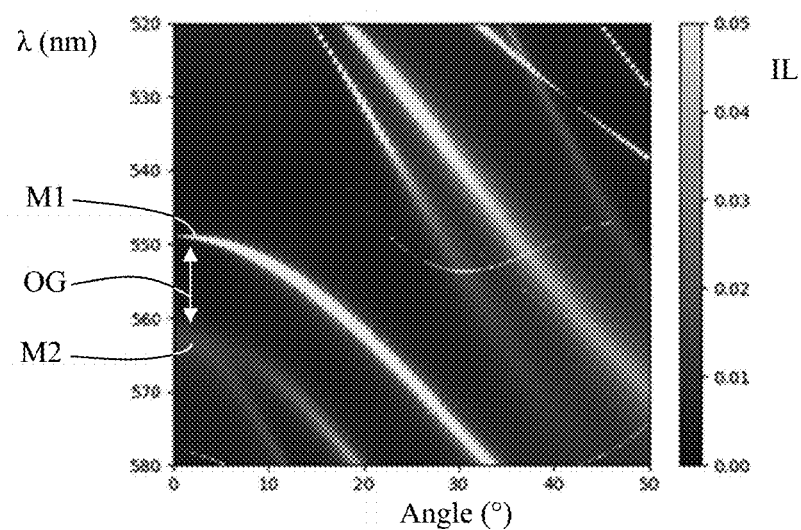
FIG. 5 is a grayscale map of the light intensity emitted by the optoelectronic comparison device depending on the emitted radiation wavelength and the emission angle illustrating the presence of two emission modes.

FIG. 5 is a grayscale map of the light intensity IL, in arbitrary units, of the radiation emitted from the emitting surface 46 of the comparison optoelectronic device depending on the wavelength λ of the emitted radiation and the emission angle in a direction orthogonal to the emitting surface 46. The bright areas of the grayscale map correspond to resonance peaks. For small emission angles, a first emission mode M1 is observed at wavelengths of around 550 nm and a second emission mode M2 at longer wavelengths. The optical gap OG corresponds to the difference between the wavelengths of the M1 and M2 modes for a given emission angle.

FIG. 6 shows an evolution curve CA of the cumulative flux F, expressed as a percentage, of the radiation emitted by the comparison optoelectronic device in a cone with an axis perpendicular to the emission surface 46 depending on the half angle at the apex of the cone. The curve CB corresponds to the evolution of the cumulative flux for a Lambertian radiation.

FIG. 7 shows a radiation pattern for the comparison optoelectronic device (DA curve) and for Lambertian radiation (DB). The DA radiation pattern has a main lobe L1, centered substantially at 0° and secondary lobes L2 centered substantially at +/−45°.

The first mode M1 corresponds to an emission intensity peak centered at the main frequency and essentially participates in the formation of the L1 lobe in the radiation diagram. The M2 mode is responsible for spreading the emission spectrum of the light-emitting diode LED as well as for the formation of the secondary lobes L2. As can be seen in FIGS. 6 and 7, a significant portion of the radiation energy of the comparison optoelectronic device is lost in the secondary lobes L2. In particular, less than 20% of the flux is emitted in the cone of half angle at the apex equal to 20°.

Figure 9:
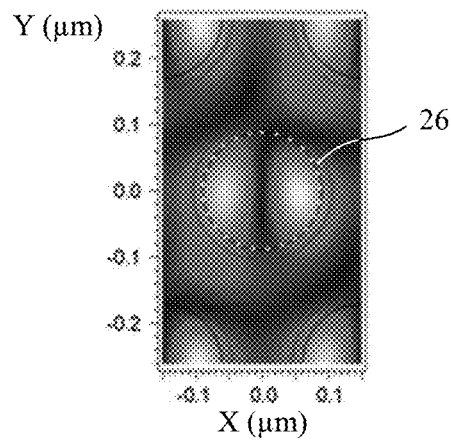
FIG. 9 is a grayscale map of a second mode amplification factor for the comparison optoelectronic device in a plane containing the active layers of the LEDs.

FIGS. 8 and 9 are grayscale maps of the amplification factor due to the photonic crystal for the first and second modes, respectively, in a plane parallel to the emission surface 42 and containing the active layers 36. The light areas correspond to areas where the amplification factor is greater. The outline of the wire 26 of a LED has been shown in dashed white lines. As a first approximation, FIGS. 8 and 9 are substantially independent of the lateral dimensions of the active layer 36.

The inventors have demonstrated that it is possible to reduce the contribution of the second M2 mode relative to the M1 mode in the radiation emitted by the optoelectronic device 5 by changing the lateral dimensions of the active layer 36, without changing the average diameter $D_{nw}$ of the lower portion 28 of the wire 26, such that the active layer 36 is located at a location where the mode M1 amplification factor is large and the mode M2 amplification factor is small. As a result, the photonic crystal essentially only amplifies photon generation according to the first M1 mode.

Figure 10:
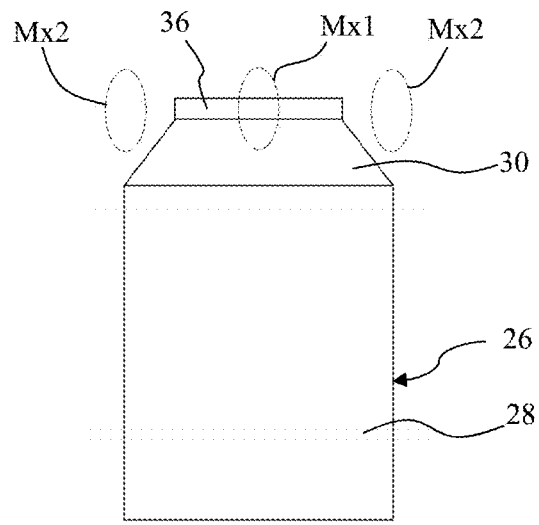
FIG. 10 is a schematic cross-sectional view of a portion of a LED of the optoelectronic device of FIG. 1 with the high amplification regions shown in FIGS. 8 and 9.
Figure 11:
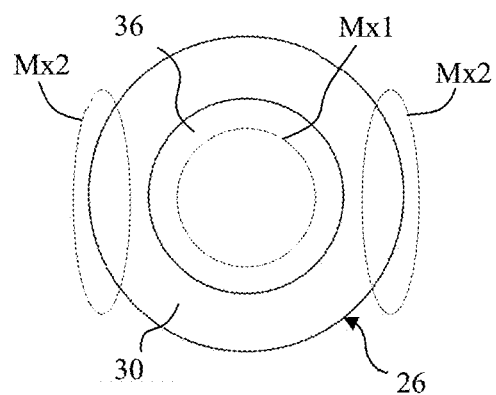
FIG. 11 is a schematic view from above of a portion of a LED of the optoelectronic device of FIG. 1 with the high gain regions shown in FIGS. 8 and 9.

FIGS. 10 and 11 are a schematic partial side sectional view and a schematic top view, respectively, of a portion of the wire 26 and the active layer 36 of the optoelectronic device 5 of FIG. 1 in which the areas Mx1 have been added, each symbolizing an area where the first mode M1 amplification factor due to the photonic crystal is high, and areas Mx2, each symbolizing an area where the second mode M2 amplification factor due to the photonic crystal is high. As shown in FIGS. 10 and 11, by selecting the thinning ratio SF, the active layer 36 can be arranged so that it is not present at the Mx2 regions.

A second simulation was performed. For the second simulation, the thinning ratio SF is equal to 1.6.

Figure 12:
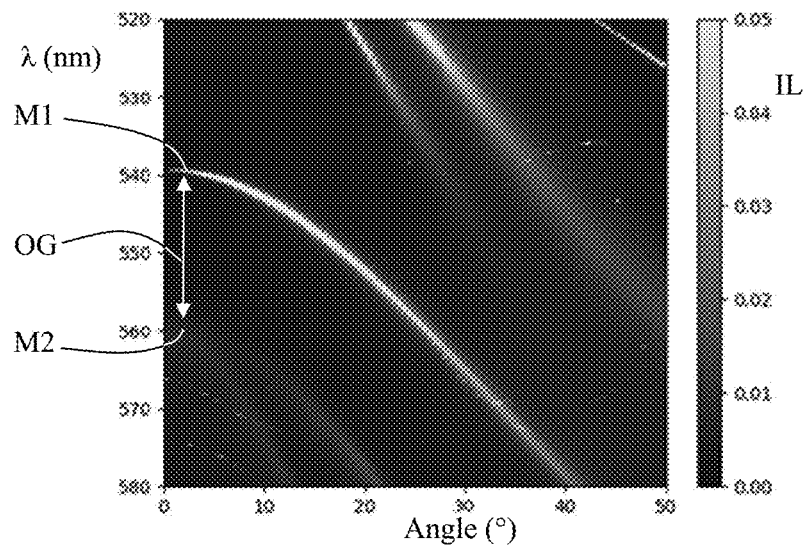
FIG. 12 is a grayscale map, obtained by simulation, of the light intensity emitted by the optoelectronic device of FIG. 1 depending on the wavelength of the emitted radiation and the emission angle for a first thinning factor of the LEDs.

FIG. 12 is a grayscale map of the light intensity IL of the radiation emitted from the emission surface 46 of the optoelectronic device 5 of the second simulation depending on the emitted radiation wavelength λ and the emission angle in relation to a direction orthogonal to the emission surface 46. Compared with the first simulation, there is a shift of the first mode M1 towards the shorter wavelengths (blue shift). The optical gap OG is thus increased. An attenuation of the second mode M2 is also observed.

A third simulation was performed. For the third simulation, the thinning ratio is equal to 1.2.

Figure 13:
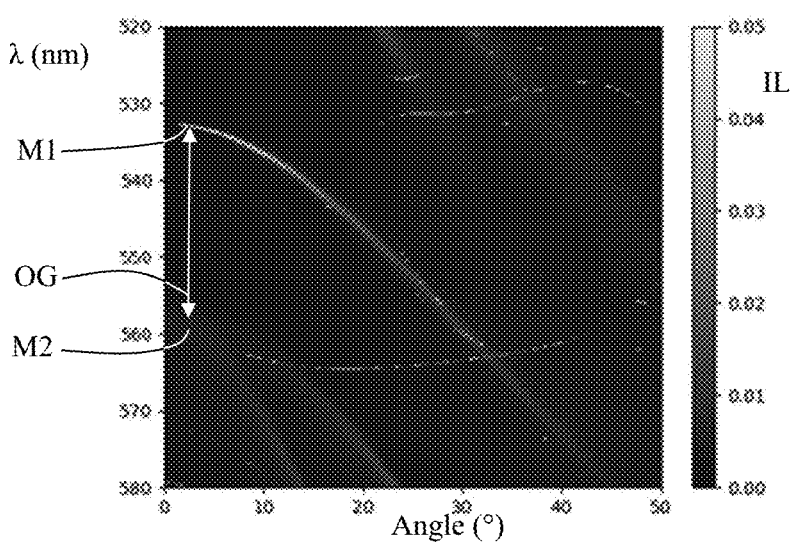
FIG. 13 is analogous to FIG. 12 for a second thinning factor of the LEDs.

FIG. 13 is a grayscale map of the light intensity IL of the radiation emitted from the emission surface 46 of the optoelectronic device 5 of the third simulation depending on the emitted radiation wavelength λ and the emission angle in a direction orthogonal to the emission surface 46. Compared to the second simulation, there is an additional shift of the first mode M1 towards the shorter wavelengths (blue shift). The optical gap OG is thus increased. An increase in the quality factor of the first M1 mode is also observed, i.e. a decrease in the spread of the first mode. Furthermore, an additional attenuation of the second mode M2 is observed.

Figure 14:
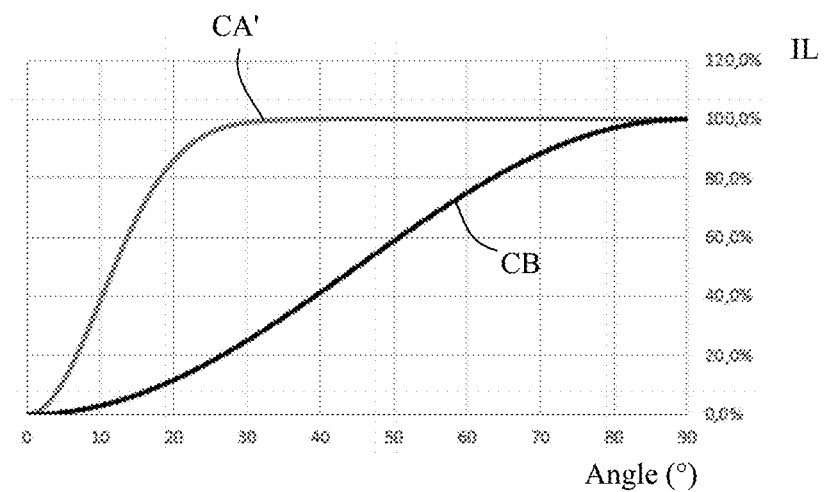
FIG. 14 is analogous to FIG. 6 for the optoelectronic device according to FIG. 1 with the second thinning factor.

FIG. 14 shows a curve CA' of the evolution of the cumulative flux, expressed as a percentage, of the radiation emitted by the optoelectronic device 5 for the third simulation in a cone of axis perpendicular to the emission surface 46 depending on the half angle at the apex of the cone. The curve CB corresponds to the evolution of the cumulative flux for a Lambertian radiation.

Figure 15:
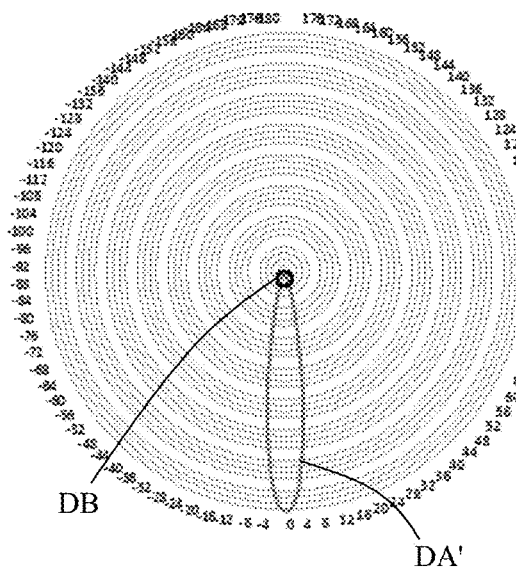
FIG. 15 is analogous to FIG. 7 for the optoelectronic device according to FIG. 1 with the second thinning factor.

FIG. 15 shows a radiation pattern for the optoelectronic device 5 of the third simulation (curve DA') and for Lambertian radiation (DB). The radiation pattern DA' has substantially a single lobe centered at 0°. There are essentially no secondary lobes.

As is apparent from FIGS. 14 and 15, most of the radiation energy of the optoelectronic device 12 is present in the single lobe DA'. In particular, more than 80% of the radiation flux is emitted in the cone of half angle at the cone equal to 20°.

Tests were performed. For the first test, an optoelectronic device with the features of the first simulation was manufactured.

Figure 16:
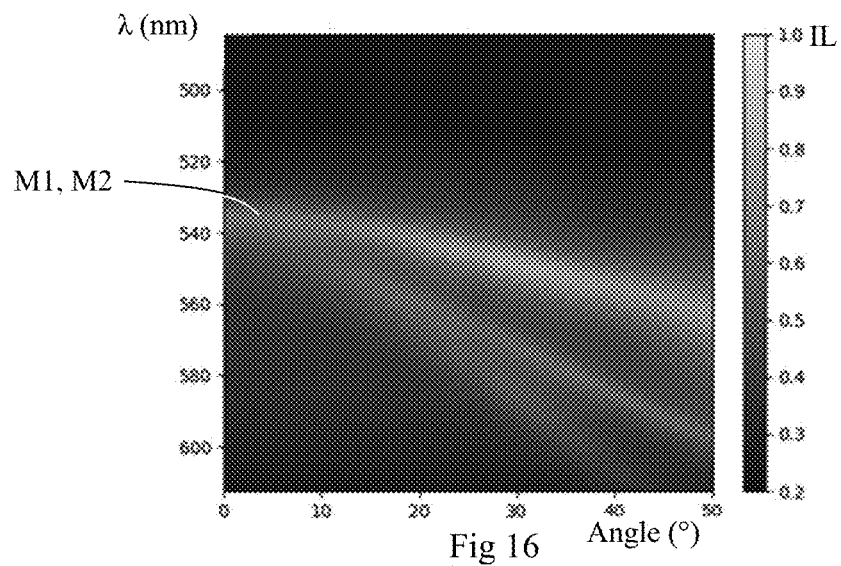
FIG. 16 is a grayscale map, obtained during a first test, of the light intensity emitted by the comparison optoelectronic device depending on the emitted radiation wavelength and the emission angle.

FIG. 16 is a grayscale map of the normalized light intensity IL of the radiation emitted from the emission surface 46 of the optoelectronic device 5 of the first test, depending on the emitted radiation wavelength λ and the emission angle in relation to a direction orthogonal to the emission surface 46.

Figure 17:
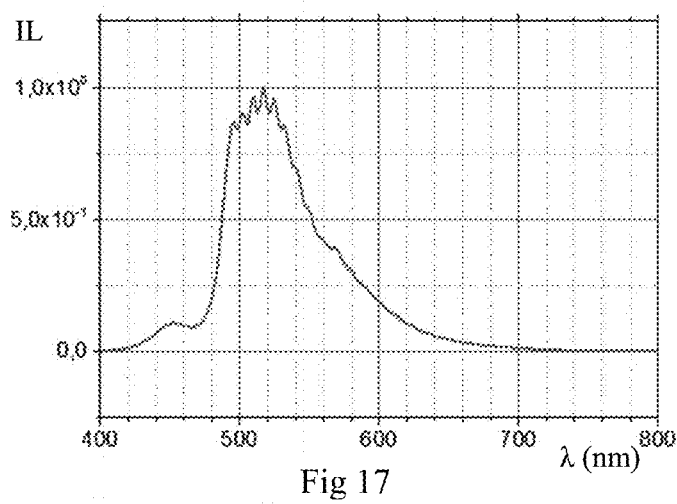
FIG. 17 shows an evolution curve obtained during the first test of the light intensity emitted by the optoelectronic comparison device, orthogonal to the emission surface, depending on the emitted radiation wavelength.

FIG. 17 is a curve of evolution, of the light intensity IL of the radiation emitted from the emission surface 46, along a direction orthogonal to the emission surface, of the optoelectronic device 5 of the first test, depending on the wavelength k.

Compared to the results of the first simulation, it is observed that there is substantially no optical difference between the first mode and the second mode at low angles. This may be due to the fact that it may be difficult to form a perfectly cylindrical wire 26 and a slight widening of the wire 26 at the top may be observed when the growth conditions should lead to a cylindrical wire 26.

For the second and third tests, an optoelectronic device 5 with the features of the third simulation was manufactured. The second and third tests differ in the reactors used in the manufacturing of the optoelectronic devices.

Figure 18:
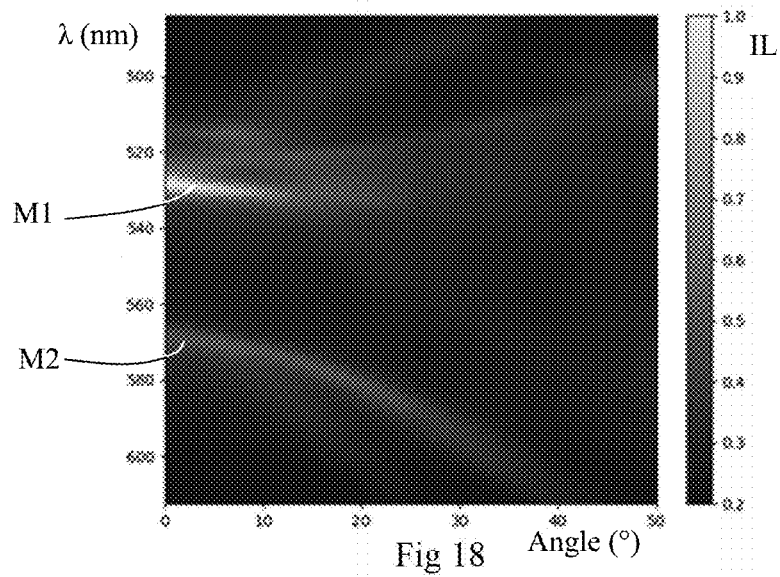
FIG. 18 is a grayscale map obtained during a second test of the light intensity emitted by the optoelectronic device of FIG. 1, depending on the emitted radiation wavelength and the emission angle.

FIG. 18 is a grayscale map of the light intensity IL of the radiation emitted from the emission surface 46 of the optoelectronic device 5 of the second trial depending on the emitted radiation wavelength λ and the emission angle in a direction orthogonal to the emission surface 46. Compared to the first trial, an increase in the optical gap OG between the first mode and the second mode is observed, as expected from the simulations.

Figure 19:
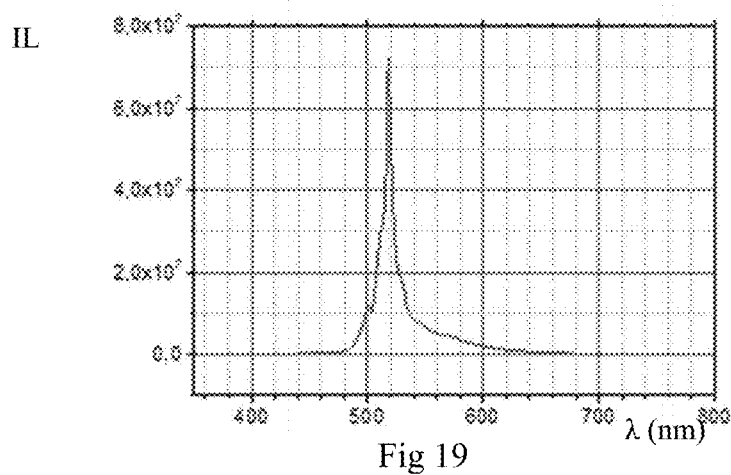
FIG. 19 shows an evolution curve obtained during a third test of the light intensity emitted by the optoelectronic device of FIG. 1, orthogonal to the emission surface, depending on the emitted radiation wavelength.

FIG. 19 is a curve of evolution, of the light intensity IL of the radiation emitted by the emission surface 46, along a direction orthogonal to the emission surface, of the optoelectronic device 5 of the third trial depending on the wavelength k. There is a narrowing of the first mode emission peak compared to FIG. 17, with the second mode not present.

Figure 20:
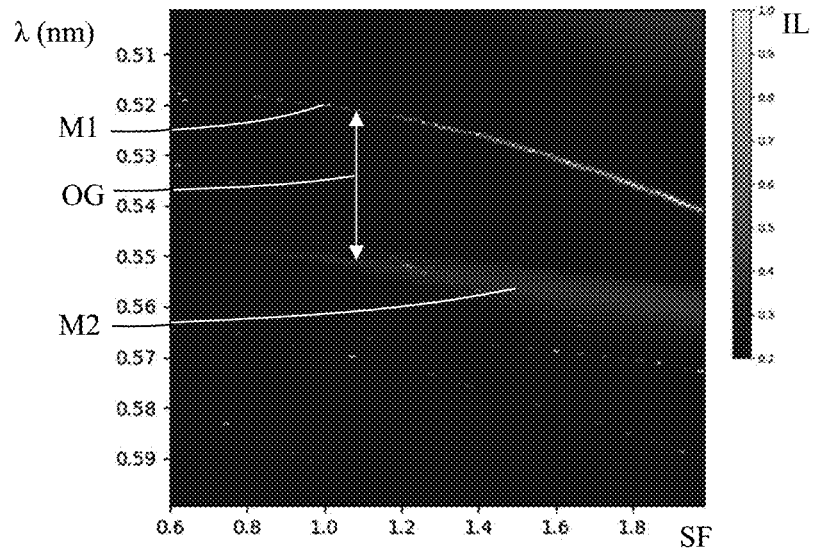
FIG. 20 is a simulated grayscale map of the light intensity emitted by the optoelectronic device of FIG. 1 depending on the emitted radiation wavelength and the thinning ratio.

FIG. 20 is a grayscale map, obtained by simulation, of the light intensity emitted by the optoelectronic device 5 of FIG. 1 depending on the wavelength λ of the emitted radiation and the thinning ratio SF, for an emission angle in a direction orthogonal to the emission surface 46 substantially equal to 0°. It can be clearly seen that the second mode M2 tends to disappear as the thinning ratio SF decreases, the first mode M1 shifts to shorter lengths, and the optical gap (OG) increases. For SF of less than or equal to 1.2, the second mode M2 becomes negligible. FIG. 20 gives the impression that the first mode M1 disappears as the thinning ratio SF decreases. In reality, the first mode M1 becomes more refined as the thinning ratio SF decreases, which means that the quality factor of the first mode M1 increases as the thinning ratio SF decreases.

Figure 21:
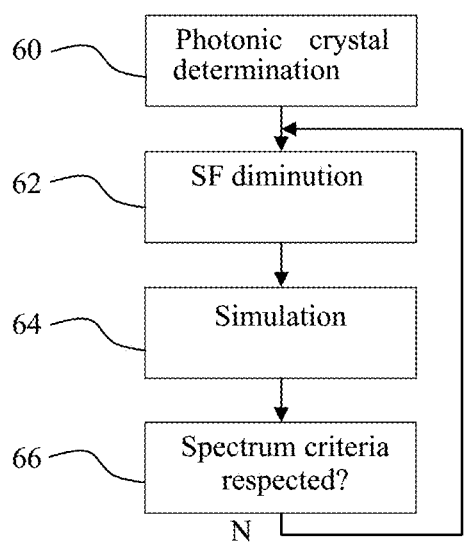
FIG. 21 is a block diagram of one embodiment of a method for designing the optoelectronic device according to FIG. 1.

FIG. 21 is a block diagram of one embodiment of a method for designing an optoelectronic device.

In step 60, features of the photonic crystal are determined to achieve desired first properties for the emission spectrum. The features of the photonic crystal may comprise the pitch a of the LED matrix and the diameter $D_{nw}$ of the wires 26. The first desired properties for the emission spectrum may include the desired main wavelength of the emission peak. According to one embodiment, determining the features of the photonic crystal may comprise performing successive computer simulations, each simulation being performed considering LEDs with a thinning ratio SF equal to 2. As an example, a simulation is performed with initial values for the pitch a and the average diameter $D_{nw}$, and these values are modified according to a given criterion such as the difference between the main wavelength of the resonance peak of the simulation relative to the desired main wavelength, this operation being repeated until the emission spectrum with the desired properties is obtained. The method continues at step 62.

In step 62, the thinning ratio SF is decreased. The method continues at step 64.

In step 64, a simulation of the operation of the optoelectronic device with the new thinning ratio SF is performed. The method continues at step 66.

In step 66, it is determined whether the method can be terminated. According to one embodiment, it is determined whether desired secondary properties of the emission radiation are achieved. The desired secondary properties may comprise the emission spectrum bandwidth and/or the emitted radiation directivity, by the absence of secondary lobes in the radiation pattern for example. If the secondary properties of the emitted radiation are achieved, the method is completed. If not, the method is continued in step 62 in which a further decrease of the thinning ratio SF is performed.

Various embodiments and variants have been described. Those skilled in the art will understand that certain features of these embodiments can be combined and other variants will readily occur to those skilled in the art. Finally, the practical implementation of the embodiments and variants described herein is within the capabilities of those skilled in the art based on the functional description provided hereinabove.

The invention claimed is:

1. An optoelectronic device comprising a matrix of axial light emitting diodes, each of the light emitting diodes comprising an active layer configured to emit electromagnetic radiation, the matrix forming a photonic crystal configured to form at least first and second resonance peaks of an amplification factor, in a plane containing the active layers, each of the first resonance peaks amplifying an intensity of said electromagnetic radiation at a first wavelength, each of the second resonance peaks amplifying the intensity of said electromagnetic radiation at a second wavelength wherein each of the light emitting diodes comprises an elongated semiconductor element along an axis, having a first portion of a first average diameter, a second portion extending from the first portion and having a cross-sectional area decreasing away from the first portion and the active layer extending from the second portion and having a second average diameter less than the first average diameter, the active layers being located at locations of the first resonance peaks and absent at the locations of the second resonance peaks.

2. The device according to claim 1, wherein twice the ratio of the second average diameter to the first average diameter is between 0.5 and 1.8.

3. The device according to claim 2, wherein twice the ratio of the second average diameter to the first average diameter is between 0.6 and 1.4.

4. The device according to claim 1, wherein the first average diameter is between 0.05 μm and 2 μm.

5. The device according to claim 4, wherein the first average diameter is between 100 nm and 1 μm.

6. The device according to claim 1, wherein a height of the second portion, measured along said axis, is less than 10% of a height of the elongated semiconductor element, measured along said axis.

7. The device according to claim 1, wherein the first portion of the elongated semiconductor element has a constant cross-section.

8. The device according to claim 1, wherein the axial light emitting diodes are arranged in an array with a pitch of between 0.1 μm and 4 μm.

9. The device according to claim 1, wherein a height of each of the elongated semiconductor elements, measured along said axis, is between 100 nm and 50 μm.

10. A method for designing the optoelectronic device according to claim 1, comprising the following steps:
 a) determining a pitch of the photonic crystal and the first average diameter by simulation, considering that the elongated semiconductor elements have a constant cross-section;
 b) decreasing the second average diameter without changing the first average diameter;

c) simulating an operation of the optoelectronic device with the active layers having the decreased second average diameter; and d) repeating steps b) and c) until the active layers are located at the locations of the first resonant peaks and absent at the locations of the second resonant peaks.

\* \* \* \* \*